United States Patent
Dong et al.

(10) Patent No.: US 11,579,483 B2
(45) Date of Patent: Feb. 14, 2023

(54) NEAR-TO-EYE DISPLAY DEVICE

(71) Applicants: Beijing BOE Optoelectronics Technology Co., Ltd., Beijing (CN); BOE Technology Group Co., Ltd., Beijing (CN)

(72) Inventors: Ruijun Dong, Beijing (CN); Xue Dong, Beijing (CN); Hao Zhang, Beijing (CN); Wenhong Tian, Beijing (CN); Yulong Wu, Beijing (CN); Chenru Wang, Beijing (CN); Ke Li, Beijing (CN); Jiarong Bai, Beijing (CN); Na Han, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/412,101

(22) Filed: Aug. 25, 2021

(65) Prior Publication Data

US 2022/0100030 A1 Mar. 31, 2022

(30) Foreign Application Priority Data

Sep. 27, 2020 (CN) .................. CN202011032050.X (51) Int. Cl.
*G02F 1/1335* (2006.01)
*G02F 1/1343* (2006.01)
(Continued)

(52) U.S. Cl.
CPC ...... *G02F 1/133526* (2013.01); *G02F 1/1343* (2013.01); *G02F 1/133541* (2021.01); *G06F 3/011* (2013.01); *G02B 2027/0185* (2013.01)

(58) Field of Classification Search
CPC ......... G02F 1/133541; G02F 1/133526; G06F 3/011; G02B 2027/0185
See application file for complete search history.

(56) References Cited

U.S. PATENT DOCUMENTS 10,120,112 B2 * 11/2018 Tabirian ................ A61F 2/1618
2018/0107000 A1 * 4/2018 Sung ........................ G02B 3/10
(Continued)

FOREIGN PATENT DOCUMENTS

| CN | 107065180 A | 8/2017 |
|---|---|---|
| CN | 108803031 A | 11/2018 |

(Continued)

OTHER PUBLICATIONS

CN202011032050.X first office action.

*Primary Examiner* — Jia X Pan
(74) *Attorney, Agent, or Firm* — IPro, PLLC (57) ABSTRACT

A near-to-eye display device, includes: a display screen configured to display different images in a first time division mode, a polarization converter at a light-emitting side of the display screen and configured to convert emitted light of the different images displayed by the display screen into first circularly polarized light rays and second circularly polarized light rays in a second time division mode. Here the first circularly polarized light rays and the second circularly polarized light rays are opposite in rotation direction. The device further includes a polarization lens at a side facing away from the display screen of the polarization converter, and a focusing lens at a side facing away from the display screen of the polarization converter. The polarization lens and the focusing lens are configured to focus the first circularly polarized light rays and the second circularly polarized light rays at positions of different focal lengths.

14 Claims, 5 Drawing Sheets

(51) Int. Cl.
    *G06F 3/01*         (2006.01)
    *G02B 27/01*     (2006.01)

(56) References Cited

U.S. PATENT DOCUMENTS

| | | | |
|---|---|---|---|
| 2018/0210222 A1* | 7/2018 | Seo | G02B 5/3025 |
| 2020/0018962 A1 | 1/2020 | Lu et al. | |
| 2020/0348527 A1* | 11/2020 | Jamali | G02B 27/0101 |
| 2022/0099974 A1* | 3/2022 | Han | G02B 27/0172 |

FOREIGN PATENT DOCUMENTS

| | | |
|---|---|---|
| CN | 111045213 A | 4/2020 |
| CN | 111624782 A | 9/2020 |
| CN | 112313556 A | 2/2021 |

* cited by examiner

NEAR-TO-EYE DISPLAY DEVICE

CROSS REFERENCE TO RELATED APPLICATIONS

This application is based on and claims priority under 35 U.S.C 119 to Chinese Patent Application No. 202011032050.X, filed on Sep. 27, 2020, in the China National Intellectual Property Administration. The entire disclosure of the above application is incorporated herein by reference.

FIELD

The disclosure relates to the field of display technology, in particular to a near-to-eye display device.

BACKGROUND

With the development of Virtual Reality (VR) and Augmented Reality (AR) technologies, near-to-eye display products, initially applied to the military field, are gradually widely used in civil fields such as film and television, education, and medical treatment. Since a source image of the near-to-eye display products is very small, it needs to be set close to human eyes so that images can be clearly formed within the observable range of the human eye. This makes design of near-to-eye display devices very difficult.

In order to meet the above design requirements, a current near-to-eye display device generally has a relatively large number of limiting members, and is large in size and weight. Thus, such device is always cumbersome to lead uncomfortable wearing experience for the users. In addition, the focal length of such display device is fixed. When the human eyes observe a display picture, both close-range images and long-range images are located at the same image plane, which is inconsistent with the situation of the human eye viewing an actual scene, which is prone to causing visual fatigue.

SUMMARY

The disclosure provides a near-to-eye display device, which can effectively shorten a focal length to realize thinning.

The near-to-eye display device provided by the disclosure includes: a display screen configured to display different images in a first time division mode, a polarization converter at a light-emitting side of the display screen and configured to convert emitted light of the different images displayed by the display screen into first circularly polarized light rays and second circularly polarized light rays in a second time division mode. Here the first circularly polarized light rays and the second circularly polarized light rays are opposite in rotation direction. The device further includes a polarization lens at a side facing away from the display screen of the polarization converter, and a focusing lens at a side facing away from the display screen of the polarization converter. The polarization lens and the focusing lens are configured to focus the first circularly polarized light rays and the second circularly polarized light rays at positions of different focal lengths, to make images of the different images focused at positions of different focal lengths.

BRIEF DESCRIPTION OF THE DRAWINGS

In order to explain technical solutions of embodiments of the disclosure more clearly, the drawings that need to be used in embodiments of the disclosure will be briefly introduced below. Apparently, the drawings introduced below are only some embodiments of the disclosure, and for those of ordinary skill in the art, on the premise of no creative labor, other drawings can also be obtained according to these drawings.

DETAILED DESCRIPTION

In order to make the above objects, features and advantages of the disclosure more obvious and easy to understand, the disclosure will be further described below in combination with the accompanying drawings and embodiments. However, example implementations can be implemented in a variety of forms and should not be construed as being limited to the implementations set forth herein; on the contrary, providing these implementations makes the disclosure more comprehensive and complete, and comprehensively communicates the concept of the example implementations to those skilled in the art. In the figures, the same reference numerals represent the same or similar structures, so their repeated description will be omitted. The words expressing positions and directions described in the disclosure are explained by taking the accompanying drawings as an example, but they can also be changed as needed, and all the changes are included in the scope of protection of the disclosure. The accompanying drawings of the disclosure are only used to illustrate the relative positional relationship and do not represent the true scale.

A near-to-eye display device is a display device worn on eyes of a user, for example, the near-to-eye display device is usually presented in the form of glasses or a helmet. The near-to-eye display device may provide the user with virtual reality (VR) experience. VR near-to-eye display technology displays images for left and right eyes respectively on near-to-eye displays corresponding to the left and right eyes. After the left and right eyes obtain image information with differences, stereo vision may be synthesized in the brain.

A current near-to-eye display device still has the problems of large size, large weight and poor imaging quality. Embodiments of the disclosure provide a near-to-eye display device, which is at least used to reduce a weight of the whole apparatus and improve the imaging quality. The near-to-eye display device provided by embodiments of the disclosure may be a VR device. In some embodiments, it may be VR glasses or a VR helmet, which is not limited here.

Figure 1:
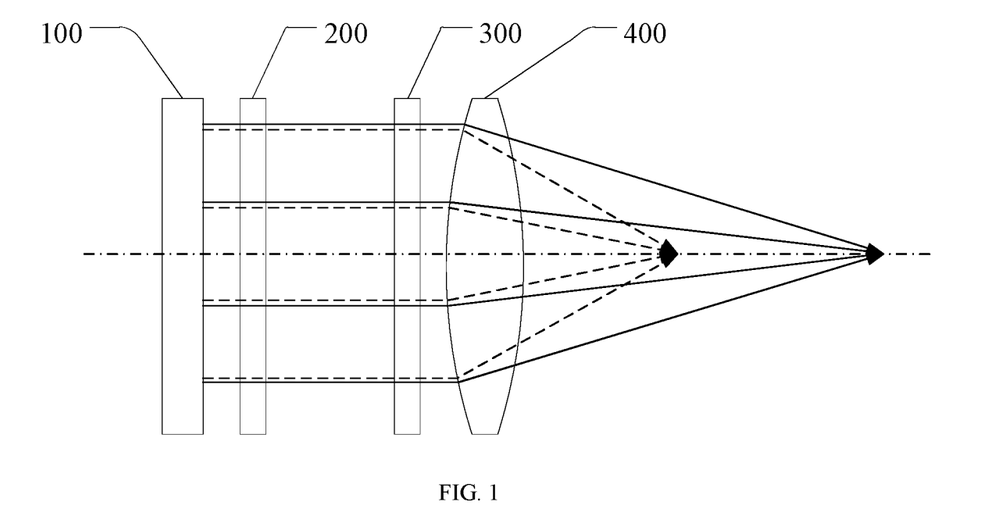
FIG. 1 illustrates an example first near-to-eye display device according to embodiments of the disclosure.
Figure 2:
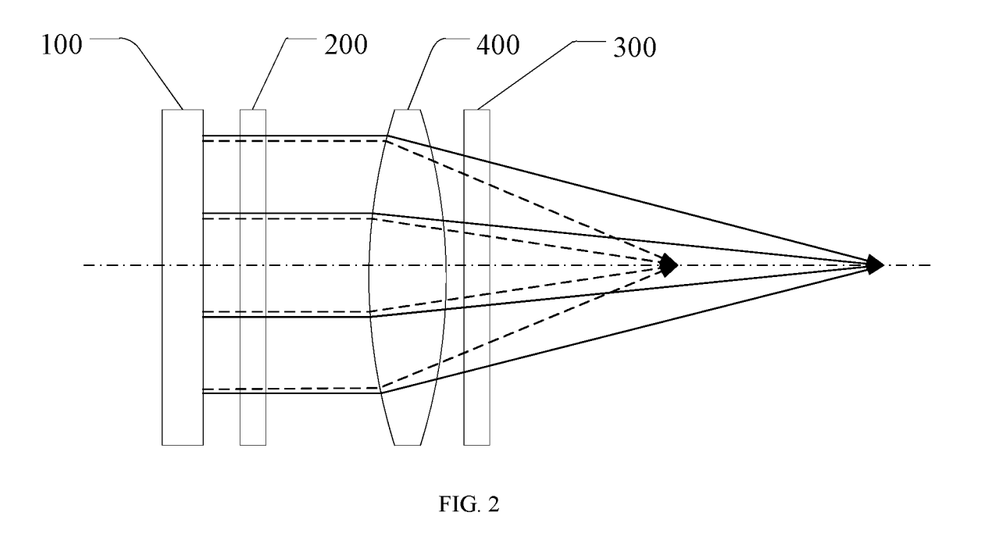
FIG. 2 illustrates an example second near-to-eye display device according to embodiments of the disclosure.

FIG. 1 and FIG. 2 are schematic structural diagrams of the near-to-eye display device provided by the disclosure. Referring to FIG. 1 and FIG. 2, the near-to-eye display device includes: a display screen 100, a polarization converter 200, a polarization lens 300 and a focusing lens 400.

The polarization lens 300 in embodiments of the disclosure is a Pancharatnam-Berry (PB) element, belonging to super lenses. A super lens has supernormal physical properties that an ordinary lens material cannot have in the aspects such as negative magnetic permeability, negative dielectric constant and negative index of refraction.

Figure 3:
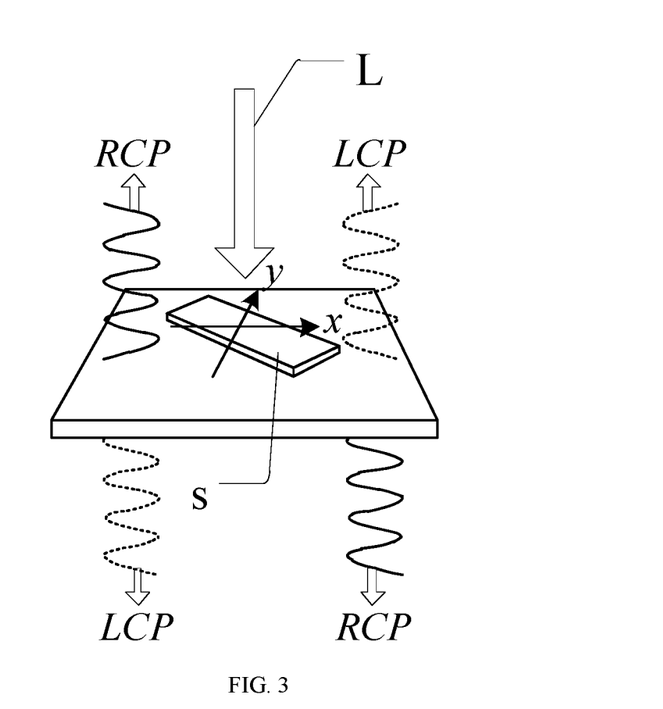
FIG. 3 illustrates the principle of a PB element according to embodiments of the disclosure.

FIG. 3 illustrates a principle of the PB element provided by embodiments of the disclosure.

Referring to FIG. 3, when light ray L enters any anisotropic artificial microstructure s (e.g., a metal strip) placed on an x-y plane, left-handed circularly polarized light ray or right-handed circularly polarized light ray excites the microstructure s to generate response currents with different amplitudes and different phases in an x direction and a y direction. The different responses in the two orthogonal directions make electromagnetic waves generated by the microstructure have a left-handed circular polarization (LCP) component and a right-handed circular polarization (RCP) component simultaneously in principle. This phase which is generated only depending on a rotation angle is a geometric phase obtained by adiabatic evolution of a photon state in high-latitude space. One feature of the geometric phase is that it is only decided by a polarization state of incident light ray and a rotation angle of the microstructure.

Figure 4:
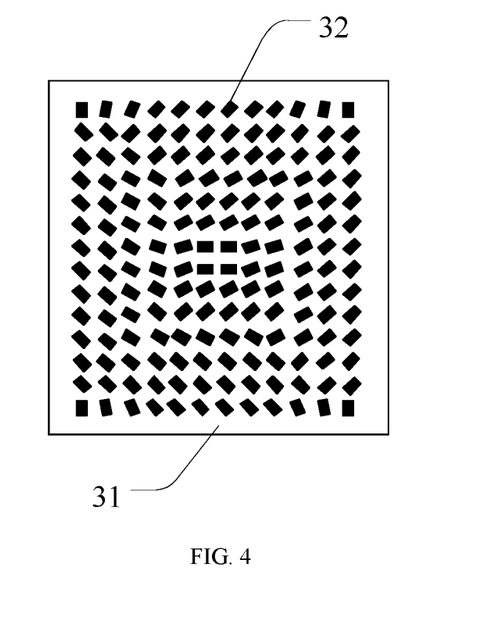
FIG. 4 illustrates an example polarization lens according to embodiments of the disclosure.

The polarization lens in embodiments of the disclosure is a PB element designed according to the above principle. FIG. 4 is a schematic structural diagram of the polarization lens provided by embodiments of the disclosure.

Referring to FIG. 4, the polarization lens provided by embodiments of the disclosure includes: a substrate 31 and a plurality of micro-nano structure units 32 disposed on the substrate. The dimension of the micro-nano structure units 32 is of a sub-wavelength order. The micro-nano structure units 32 with proper dimensions can be distributed in rotation angles to form a two-dimensional plane structure according to a specific arrangement, so that the amplitude, phase, polarization and the like of the incident light rays may be flexibly regulated. The polarization lens breaks through the limitation of electromagnetic property of a traditional material. Further, its two-dimensional plane structure solves the problems of large processing difficulty of a three-dimensional structure and the like. Thus, an overall thickness of a display device can be lowered, and convenience is brought to integration and miniaturization of the near-to-eye display device.

In embodiments of the disclosure, parameter, in the aspects of length, width, height, duty cycle, rotation angle and the like, of the micro-nano structure units 32 are set to allow the first circularly polarized light rays and second circularly polarized light rays to converge at the focal point.

Figure 5:
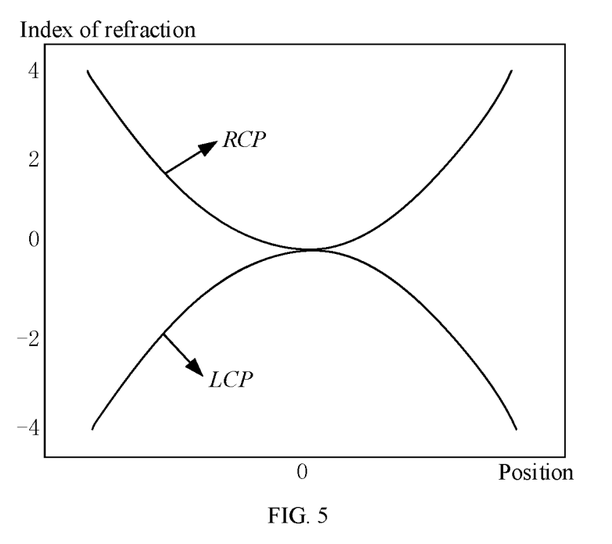
FIG. 5 illustrates an example graph of an index of refraction of a polarization lens according to embodiments of the disclosure.

FIG. 5 is a graph of the polarization lens provided by embodiments of the disclosure.

Referring to FIG. 5, the polarization lens in embodiments of the disclosure has different indexes of refraction for the left-handed circularly polarized (LCP) light rays and the right-handed circularly polarized (RCP) light rays entering different positions of the polarization lens. For the right-handed circularly polarized (RCP) light rays, an index of refraction at a center position 0 of the polarization lens is the smallest, while with increasing of a distance from the center position 0, the index of refraction is increased. The polarization lens, acts as a concave lens for the right-handed circularly polarized (RCP) light rays and causes the right-handed circularly polarized (RCP) light rays to diverge. While for the left-handed circularly polarized (LCP) light rays, the index of refraction at the center position 0 of the polarization lens is the largest, while with increasing of the distance from the center position 0, the index of refraction is decreased. That is, for the left-handed circularly polarized (LCP) light rays, the polarization lens acts as convex lens and causes the left-handed circularly polarized (LCP) light rays to converge.

Figure 6:
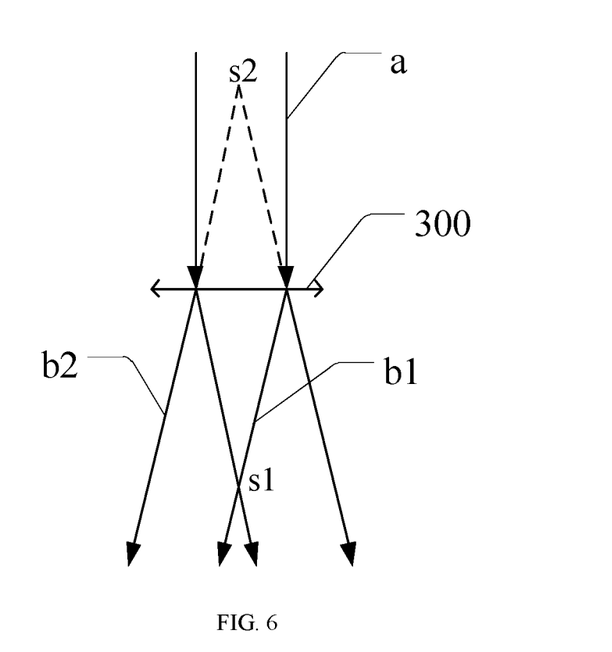
FIG. 6 illustrates the working principle of a polarization lens according to embodiments of the disclosure.

FIG. 6 illustrates a working principle of the polarization lens provided by embodiments of the disclosure.

Referring to FIG. 6, after the polarization lens 300, the left-handed circularly polarized light rays b1 in the incident light rays converge at a focal point s1. While the right-handed circularly polarized light rays b2 in the incident light diverge as they leave the lens 300, where sight lines for the light rays b2 converge at a focal point s2. This shows that the polarization lens 300 has different actions for the left-handed circularly polarized light rays and the right-handed circularly polarized light rays. While the focal points are positioned at different sides of the lens 300 but with the same distance from the lens 300.

Embodiments of the disclosure only describes the principle by taking the situation that the left-handed circularly polarized light rays converge after the lens and the right-handed circularly polarized light rays diverge as they leave the lens as an example. In some embodiments, by adjusting the micro-nano structure units in the polarization lens, the left-handed circularly polarized light rays can converge after the lens and the right-handed circularly polarized light rays can diverge as they leave the lens, and embodiments of the disclosure does not limit the above two cases.

It can be known from the above analysis that the polarization lens 300 has different focal lengths for circularly polarized light rays in different rotation directions. Based on this, embodiments of the disclosure applies the polarization lens 300 to the near-to-eye display device to focus different images to different positions to realize light field display of multiple focal planes, so as to optimize a viewing effect of the near-to-eye display device.

Referring to FIG. 1 and FIG. 2, the near-to-eye display device provided by embodiments of the disclosure further includes: the display screen 100, the polarization converter 200 located at a light-emitting side of the display screen, and the polarization lens 300 and the focusing lens 400 both located at a side, facing away from the display screen 100, of the polarization converter 200.

The display screen 100 is configured to display different images in a time division mode.

In embodiments of the disclosure, the display screen 100 may be one of a liquid crystal display, a light emitting diode display, a micro-light emitting diode display, an organic light-emitting diode display, and a micro-organic light-emitting diode display, which is not limited here.

The Liquid Crystal Display (LCD) is mainly composed of a backlight module and a liquid crystal display panel. The liquid crystal display panel does not emit light itself, and needs to use a light source provided by the backlight module to achieve brightness display. The imaging principle of the LCD is that liquid crystals are placed between two pieces of conductive glass, and an electric field effect that liquid crystal molecules are distorted is caused by driving of an electric field between two electrodes, so as to control transmission or shielding functions of a backlight source, thereby displaying images. If color filters are added, color images may be displayed. The liquid crystal display technology is relatively mature, and a liquid crystal display screen has a low cost and excellent performance.

The Light Emitting Diode (LED) display is a display screen composed of LED arrays, LEDs are used as display sub-pixels, and images may be displayed by controlling display brightness of the LEDs. The LED display has the characteristics of high brightness, low power consumption, low voltage requirement, small and portable device and the like. Using the LED display as the display screen 100 in the near-to-eye display device facilitates miniaturization of the near-to-eye display device.

The Micro-Light Emitting Diode (Micro-LED) display adopts an LED chip as a light emitting unit, and compared with a traditional LED, the Micro-LED has a smaller size, so that more pixels may be disposed in a limited display region, thereby increasing the image resolution.

An Organic Light-Emitting Diode (OLED) display is also called an organic electroluminescence display and an organic light-emitting semiconductor display. The OLED display belongs to current type organic light-emitting components, utilizing a phenomenon of light emitting caused by carrier injection and compounding. The light emitting intensity is proportional to injected currents. Under the action of an electric field, in an OLED, holes generated by an anode and electrons generated by a cathode will move to be injected into a hole transport layer and an electron transport layer respectively, and then migrate to a light-emitting layer. When the holes and the electrons meet at the light-emitting layer, energy excitons are generated, thereby exciting light-emitting molecules to generate visible light finally. The OLED display is a self-luminance display screen, thereby not needing a backlight module. As such, an overall component thickness is small, miniaturization of the near-to-eye display device is facilitated, and overall apparatus installation is better facilitated.

The micro-organic light-emitting diode display is formed by miniaturizing light-emitting units of organic light-emitting diodes, and therefore more pixels may be designed in a limited size, and a resolution of the display screen is increased.

In embodiments of the disclosure, the display screen 100 is configured to display different images in a time division mode. The display screen 100 may switch the displayed images according to a certain frequency. In some embodiments, foreground images and background images may be switched to be displayed according to the certain frequency. In some embodiments, the switching frequency is greater than a frequency that may be distinguished by human eyes, thereby avoiding the problem of flickering of the images viewed by the human eyes.

The different images displayed by the display screen 100 will finally be focused with different focal lengths, so that a certain depth-of-field range may be formed to realize multi-focal-plane light field display. When such images are viewed by the human eyes, the situation is more in line with the situation of viewing an actual scene. That is, when a close object is observed, a distant object becomes blurry, and when the distant object is observed, the close object becomes blurry, thereby avoiding visual fatigue caused by focusing with the same focal length for a long time.

The polarization converter 200 is located at the light-emitting side of the display screen 100.

In embodiments of the disclosure, the polarization converter 200 is configured to convert a polarization state of emitted light rays of the display screen 100. The polarization converter 200 is configured to convert emitted light rays of the different images displayed by the display screen 100 into first circularly polarized light rays and second circularly polarized light rays in a time division mode. The first circularly polarized light rays and the second circularly polarized light rays are opposite in rotation direction. The first circularly polarized light rays may be left-handed circularly polarized light rays, and the second circularly polarized light rays may be right-handed circularly polarized light rays; or, the first circularly polarized light rays may be right-handed circularly polarized light rays, and the second circularly polarized light rays may be left-handed circularly polarized light rays.

Since the polarization lens 300 may have different focal lengths for the circularly polarized light rays in different rotation directions, in embodiments of the disclosure, the emitted light rays of the different images displayed by the display screen 100 are needed to be converted into the circularly polarized light rays in different rotation directions before approaching the lens 300. As such, by the polarization lens 300, different images can be formed at different positions and display images with different image planes are formed.

For instance, the display screen 100 may display a first image and a second image in a time division mode, where one of the first image and the second image is a foreground image, and the other is a background image. The display screen 100 switches the first image and the second image. Meanwhile, the polarization converter 200 may convert emitted light rays for the first image into the first circularly polarized light rays when the display screen 100 displays the first image and convert emitted light rays for the second image into the second circularly polarized light rays when the display screen 100 displays the second image. Afterwards, the polarization lens 300 may focus the first circularly polarized light rays and the second circularly polarized light rays at different positions, so that the first image and the second image are formed on different image planes to achieve multi-focal-plane display.

In some embodiments, the display screen 100 may be a liquid crystal display screen or an organic light-emitting diode display screen, where a polarization layer is disposed on the outermost side of the liquid crystal display screen or the organic light-emitting diode display screen. As such, the emitted light rays of the display screen 100 are linearly polarized light rays. In this case, the polarization converter 200 may be a liquid crystal box configured to provide a certain phase retardation quantity so as to convert the linearly polarized light emitted from the display screen 100 into circularly polarized light rays when the light rays leave the liquid crystal box.

Figure 7:
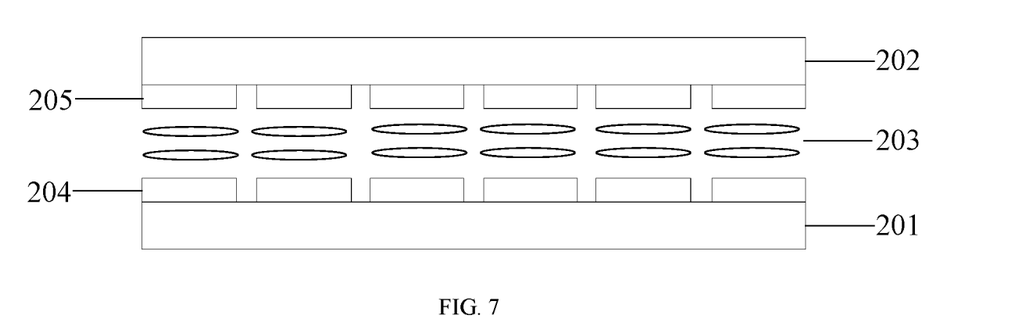
FIG. 7 illustrates an example of a liquid crystal box in a first working state according to embodiments of the disclosure.

FIG. 7 is an example first liquid crystal box provided by embodiments of the disclosure.

Referring to FIG. 7, the liquid crystal box includes: a first substrate 201 and a second substrate 202 disposed oppositely, a liquid crystal layer 203 between the first substrate 201 and the second substrate 202, a first control electrode 204 on a side, facing the liquid crystal layer 203, of the first substrate 201, and a second control electrode 205 on a side, facing the liquid crystal layer 203, of the second substrate 202.

In some embodiments, by applying different control signals to the first control electrode 204 and the second control electrode 205, and liquid crystal molecules in the liquid crystal layer 203 may be controlled to overturn to different extents. While conversion of the liquid crystal molecules may generate different phases, thereby achieving the action of providing a phase retardation quantity.

Figure 8:
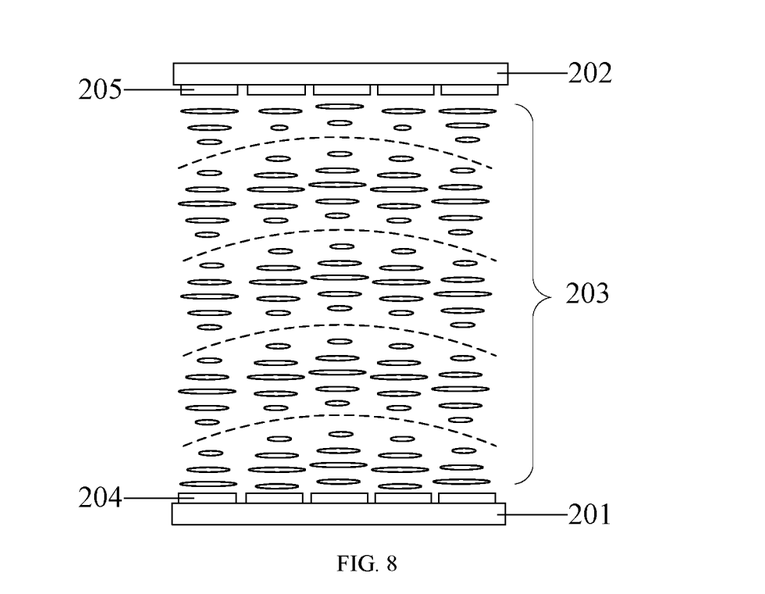
FIG. 8 illustrates a working principle of a liquid crystal box according to embodiments of the disclosure.

FIG. 8 illustrates a working principle of the liquid crystal box provided by embodiments of the disclosure.

Referring to FIG. 8, when the liquid crystal molecules in the liquid crystal layer 203 are in a certain state, the same phase may be generated at the position in the same dotted line in FIG. 8, the deflection degree, namely the generated phase of the liquid crystal molecules at all points on the same dotted line is the same, where the dotted lines on FIG. 8 are equiphase lines. As such, by controlling the signals applied to the first control electrode 204 and the second control electrode 205, the liquid crystal molecules may generate deflection of different degrees to generate required phases so as to achieve the action of converting the linearly polarized light rays into the circularly polarized light rays.

In some embodiments, when a first signal is applied to the first control electrode 204 and the second control electrode 205, the liquid crystal box may generate a first phase retardation quantity. Meanwhile, the linearly polarized light rays emitted from the display screen 100 may be converted into the first circularly polarized light rays under the action of the first phase retardation quantity. When a second signal is applied to the first control electrode 204 and the second control electrode 205, the liquid crystal box may generate a second phase retardation quantity. Meanwhile, the linearly polarized light rays emitted from the display screen 100 may be converted into the second circularly polarized light rays under the action of the second phase retardation quantity. Therefore, by signal control over the liquid crystal box, the different images displayed by the display screen 100 in a time division mode may be converted into the circularly polarized light rays different in rotation direction.

Figure 9:
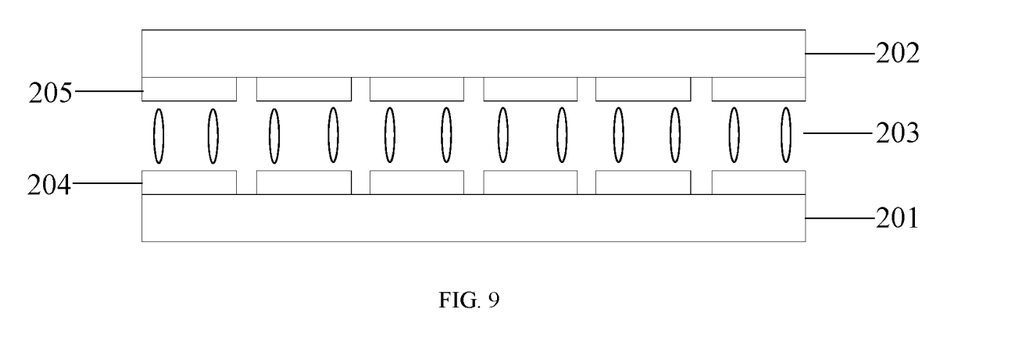
FIG. 9 illustrates an example of a liquid crystal box in a second working state according to embodiments of the disclosure.

FIG. 9 illustrates an example second liquid crystal box provided by embodiments of the disclosure. Taking the liquid crystal box shown by FIG. 7 and FIG. 9 as an example, as shown in FIG. 7, when no electric signal is applied to the first control electrode 204 and the second control electrode 205, that is, the above first signal is 0, the liquid crystal layer 203 is in an initial state. At this time, the first phase retardation quantity may be generated to convert the linearly polarized light rays into the first circularly polarized light rays when the light 1 rays eave the liquid crystal box. As shown in FIG. 9, when the second signal is applied to the first control electrode 204 and the second control electrode 205, the liquid crystal molecules in the liquid crystal layer 203 are overturned by 90° compared with the initial state, and at the moment, a second phase retardation quantity may be generated to convert the linearly polarized light rays into the second circularly polarized light rays after the light rays pass the liquid crystal box.

The above first phase retardation quantity and second phase retardation quantity may convert the linearly polarized light rays with the same polarization direction into the circularly polarized light rays with opposite rotation directions. Here specific values of the first phase retardation quantity and the second phase retardation quantity are not limited in embodiments of the disclosure.

In some embodiments of the disclosure, the display screen 100 may be a light-emitting diode display screen or a micro-light emitting diode display screen, emitted light of the light-emitting diode display screen or the micro-light emitting diode display screen is natural light. In this case, a polarizer is needed to facilitate converting the natural light rays into the circularly polarized light rays.

Figure 10:
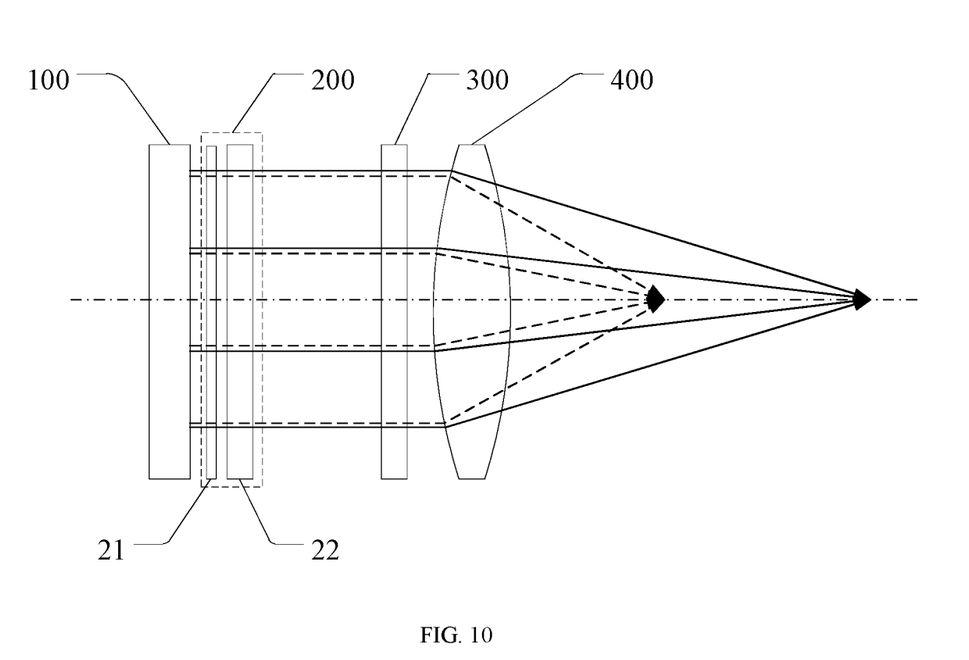
FIG. 10 illustrates an example third near-to-eye display device according to embodiments of the disclosure.

FIG. 10 illustrates an example third near-to-eye display device provided by embodiments of the disclosure.

Referring to FIG. 10, when the emitted light rays of the display screen 100 are natural light rays, the polarization converter 200 includes: a polarizer 21 and a liquid crystal box 22. The polarizer 21 is located at the light-emitting side of the display screen 100. The liquid crystal box 22 is located at a side, facing away from the display screen 100, of the polarizer 21. The polarizer is configured to convert the emitted light rays of the display screen 100 into linearly polarized light rays which will enter the liquid crystal box 22. The liquid crystal box 22 is configured to provide a certain phase retardation quantity so as to make the linearly polarized light rays converted by the polarizer 21 of the display screen 100 to be converted into the circularly polarized light rays after the light rays pass the liquid crystal box.

The specific structure and function of the liquid crystal box 22 are the same as the above embodiment, and under control of the first signal, the liquid crystal box may provide the first phase retardation quantity to convert the linearly polarized light rays converted by the polarizer 21 into the first circularly polarized light rays under the action of the first phase retardation quantity. Under control of the second signal, the liquid crystal box provides the second phase retardation quantity to convert the linearly polarized light rays converted by the polarizer 21 into the second circularly polarized light rays under the action of the second phase retardation quantity. The above first circularly polarized light rays may be left-handed circularly polarized light rays, and the second circularly polarized light rays are right-handed circularly polarized light; or, the first circularly polarized light rays are right-handed circularly polarized light rays, and the second circularly polarized light rays are left-handed circularly polarized light rays. No limitation is made here. For a specific working principle of the liquid crystal box, reference may be made to the above embodiment, which is not repeated here.

It can be seen that the polarization converter 200 needs to adjust the phase retardation quantity in cooperation with the image switching frequency of the display screen 100. For example, the display screen 100 switches the first image and the second image with a set frequency for display, the polarization converter 200 may perform switching with the same frequency. As such, when the display screen 100 displays the first image, the polarization converter 200 provides the first phase retardation quantity so as to convert the emitted light rays of the first image into the first circularly polarized light rays. When the display screen 100 displays the second image, the polarization converter is switched to provide the second phase retardation quantity so as to convert the emitted light rays of the second image into the second circularly polarized light rays.

In embodiments of the disclosure, the frequency of switching the displayed images of the display screen 100 is equal to the frequency of switching the phase retardation quantities of the polarization converter 200. Besides, the switching frequency of the display screen 100 and the switching frequency of the polarization converter 200 need to be greater than a frequency that may be distinguished by human eyes, thereby avoiding the problem of flickering of the images viewed by the human eyes. In some embodiments, the switching frequency of the display screen 100 is greater than or equal to 100 Hz, preferably greater than 120 Hz. Correspondingly, the switching frequency of the polarization converter 200 is greater than or equal to 100 Hz, preferably greater than 120 Hz.

After the polarization converter 200 converts the emitted light rays of the different images displayed by the display screen 100 into the circularly polarized light rays with different rotation directions, the circularly polarized light rays enter the polarization lens 300.

Referring to FIG. 1 and FIG. 2, the near-to-eye display device provided by embodiments of the disclosure further includes: the polarization lens 300 and the focusing lens 400. The polarization lens 300 and the focusing lens 400 are both located at a side, facing away from the display screen 100, of the polarization converter 200.

In some embodiments, as shown in FIG. 1, the focusing lens 400 may be disposed at a side, facing away from the polarization converter 200, of the polarization lens 300; or, as shown in FIG. 2, the focusing lens 400 may be disposed between the polarization lens 300 and the polarization converter 200. Disposing the focusing lens 400 at the side, facing away from the polarization converter 200, of the polarization lens 300 may prevent a polarization state of light rays from changing when the light rays pass the focusing lens 400, thereby guaranteeing that the polarization lens 300 fully acts on the converted first circularly polarized light rays and second circularly polarized light rays.

It can be known from the introduction of the principle of the polarization lens 300 that the polarization lens 300 may form two conjugated focal points, having the action of a convex lens on one of the circularly polarized light rays with different rotation directions and having the action of a concave lens on the other circularly polarized light rays.

In the near-to-eye display device, an imaging lens is generally configured to form an upright and enlarged virtual image of a displayed image of the display screen, and thus the focusing lens 400 is added in the near-to-eye display device of embodiments of the disclosure to adjust the two focal lengths formed by the polarization lens 300. An optical system composed of the focusing lens 400 and the polarization lens 300 is used as the imaging lens of the near-to-eye display device.

The focusing lens 400 may adjust the focal length of the polarization lens 300 acting as the concave lens, to make the optical system act as the convex lens. While the focusing lens 400 may adjust the focal length of the polarization lens 300 acting as the convex lens to make the optical system act as a convex lens with a shorter focal length.

Therefore, when the polarization converter 200 outputs the first circularly polarized light rays and the second circularly polarized light rays in a time division mode, the two kinds of circularly polarized light rays may focus at positions of the different focal lengths of the imaging lens composed of the polarization lens 300 and the focusing lens 400 to form image planes with different depths, so as to achieve multi-focal-plane light field display. The human eyes see different depths when viewing images on different focal planes, which better conforms to a scenario when the human eyes view a real scene, thereby avoiding visual fatigue caused by focusing to the same focal length for a long time.

As shown in FIG. 1 and FIG. 2, in some embodiments of the disclosure, the focusing lens 400 may be a geometric optical lens with a fixed focal length, or the focusing lens 400 may also be a lens set with a fixed focal length, which is not limited here. The above geometric optical lens may be a spherical lens, a non-spherical lens or a freeform lens and other forms, and is disposed according to actual requirements, which is not limited here.

When the focusing lens 400 has the fixed focal length, the focusing lens 400 may adjust the two focal lengths of the polarization lens 300, so that the optical system composed of the polarization lens 300 and the focusing lens 400 finally has two different focal lengths, and the displayed images may be focused on two focal planes.

Thus, the display screen 100 displays the first image and the second image in a time division mode, while the polarization converter 200, in a time division mode, converts the emitted light rays for the first image into the first circularly polarized light rays and converts the emitted light rays for the second image into the second circularly polarized light rays. The polarization lens and the focusing lens make the first circularly polarized light rays converge with the first focal length and the second circularly polarized light rays converge with the second focal length. Therefore, the first image may be focused at the position of the first focal length, and the second image may be focused at the position of the second focal length, so that the first image and the second image generate a certain depth of field. When the human eyes view the first image, the second image is blurry; and when the human eyes view the second image, the first image is blurry, which is consistent with a feeling of viewing a real scene by the human eyes.

Figure 11:
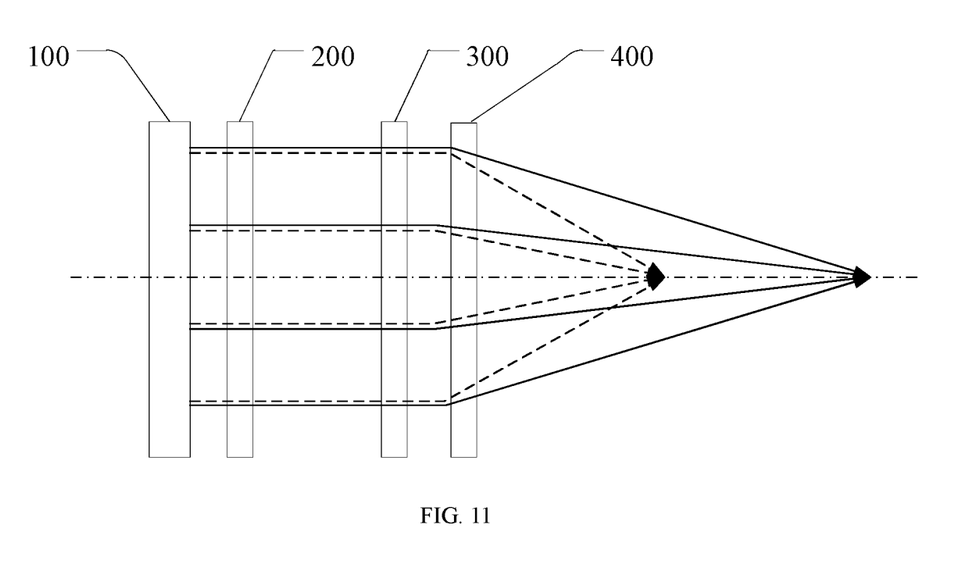
FIG. 11 illustrates an example fourth near-to-eye display device according to embodiments of the disclosure.

FIG. 11 illustrates an example fourth near-to-eye display device provided by embodiments of the disclosure.

Referring to FIG. 11, in some embodiments of the disclosure, the focusing lens 400 may be a liquid crystal lens. The specific structure of the liquid crystal lens is similar to the liquid crystal box shown in FIG. 7 and FIG. 8. The liquid crystal lens includes two substrates disposed oppositely, a liquid crystal layer between the two substrates, and control electrodes located between the liquid crystal layer and the substrates respectively. By applying signals to the control electrodes, the liquid crystal lens may be equivalent to a geometric optical lens, and by applying different signals, the liquid crystal lens may have a plurality of focal lengths.

In embodiments of the disclosure, control signals are applied to the liquid crystal lens in a time division mode, so that the liquid crystal lens has n different focal lengths in a time division mode. When the focal length of the liquid crystal lens is fixed, under the action of the liquid crystal lens, the optical system composed of the polarization lens 300 and the liquid crystal lens has two different focal lengths for the circularly polarized light rays with different rotation directions. Under the state, two different images displayed by the display screen may be focused at positions of different focal lengths. So, when the focal length of the liquid crystal lens is adjusted each time, the two images may be focused at positions of different focal lengths, and by applying the control signals in the time division mode to make the liquid crystal lens have different focal lengths in a time division mode, the near-to-eye display device may have 2, 4, 6 or more focal planes, so that multi-focal-plane light field display is achieved.

In some embodiments, the display screen 100 displays 2n different images in a time division mode, while the polarization converter 200, in a time division mode, converts emitted light rays for n images displayed by the display screen 100 into the first circularly polarized light rays and converts emitted light rays for remaining n images displayed by the display screen 100 into the second circularly polarized light rays. The polarization lens 300 and the liquid crystal lens focus the first circularly polarized light rays of the n images to positions of n different first focal lengths and focus the second circularly polarized light rays of the remaining n images at positions of n different second focal lengths. Here the first focal lengths and the second focal lengths are all unequal, and n is an integer greater than or equal to 1.

As an example, the display screen 100 displays a first image, a second image, a third image and a fourth image in a time division mode. When the display screen 100 displays the first image, the polarization converter 200 provides the first phase retardation quantity to convert the emitted light rays of the first image into the first circularly polarized light rays when the light rays leave the polarization converter 200. When the display screen 100 displays the second image, the polarization converter 200 provides the second phase retardation quantity to convert the emitted light rays of the second image into the second circularly polarized light rays when the light rays leave the polarization converter 200. When the display screen 100 displays the third image, the polarization converter 200 provides the first phase retardation quantity to convert emitted light rays of the third image into the first circularly polarized light rays when the light rays leave the polarization converter 200. When the display screen 100 displays the fourth image, the polarization converter 200 provides the second phase retardation quantity to convert emitted light rays of the fourth image into the second circularly polarized light rays when the light rays leave the polarization converter 200.

When the display screen 100 displays the first image and the second image, the liquid crystal lens has a fixed focal length, while the optical system composed of the polarization lens 300 and the liquid crystal lens has a first focal length and a second focal length. The first circularly polarized light rays of the first image is focused at a position of the first focal length after passing the polarization lens 300 and the liquid crystal lens, and the second circularly polarized light rays of the second image is focused at a position of the second focal length after passing the polarization lens 300 and the liquid crystal lens.

When the display screen 100 displays the third image and the fourth image, the liquid crystal lens has another fixed focal length, while the optical system composed of the polarization lens 300 and the liquid crystal lens has a third focal length and a fourth focal length. The first circularly polarized light rays of the third image is focused at a position of the third focal length after passing the polarization lens 300 and the liquid crystal lens, and the second circularly polarized light rays of the fourth image is focused at a position of the fourth focal length after passing the polarization lens 300 and the liquid crystal lens.

Therefore, when the liquid crystal lens has two focal lengths in a time division mode, the four images displayed by the display screen may be focused at four different focal lengths respectively to achieve four-focal-plane light field display. When the liquid crystal lens has more focal lengths, light field display of more focal planes may be achieved, and its working process is similar to the above example, which is not repeated here.

The near-to-eye display device provided by the disclosure includes: the display screen configured to display the different images in the time division mode; the polarization converter located at the light-emitting side of the display screen and configured to convert the emitted light rays of the different images displayed by the display screen into the first circularly polarized light rays and the second circularly polarized light rays in the time division mode. Here the first circularly polarized light rays and the second circularly polarized light rays are opposite in rotation direction. The display device further includes the polarization lens located at the side facing away from the display screen of the polarization converter, and the focusing lens located at the side facing away from the display screen of the polarization converter. Here the polarization lens and the focusing lens are configured to focus the first circularly polarized light rays and the second circularly polarized light rays to positions of different focal lengths so as to make the different images formed on different image planes. Using the polarization lens as an imaging element may lower the overall thickness of the near-to-eye display device, and convenience is brought to integration and miniaturization. Focusing the different images to positions of different focal lengths may achieve multi-focal-plane light field display, thereby avoiding visual fatigue caused by human eyes focusing to the same focal length for a long time.

Although the preferred embodiments of the disclosure have been described, those skilled in the art can make additional changes and modifications on these embodiments once they know the basic creative concept. So the appended claims are intended to be construed to include the preferred embodiments and all changes and modifications that fall into the scope of the disclosure.

Apparently, those skilled in the art can make various modifications and variations to the disclosure without departing from the spirit and scope of the disclosure. In this way, under the condition that these modifications and variations of the disclosure fall within the scope of the claims of the disclosure and their equivalent technologies, the disclosure is also intended to include these modifications and variations.

What is claimed is:

1. A near-to-eye display device, comprising:
   a display screen, configured to display different images in a first time division mode;
   a polarization converter, located at a light-emitting side of the display screen, and configured to convert emitted light rays for the different images displayed by the display screen into first circularly polarized light rays and second circularly polarized light rays in a second time division mode, wherein the first circularly polarized light rays and the second circularly polarized light rays are opposite in rotation direction;
   a polarization lens, located at a side, facing away from the display screen, of the polarization converter; and
   a focusing lens, located at the side, facing away from the display screen, of the polarization converter;
   wherein
   the polarization lens and the focusing lens are configured to focus the first circularly polarized light rays and the second circularly polarized light rays at positions of different focal lengths, to make images of the different images focused at positions of different focal lengths.

2. The near-to-eye display device according to claim 1, wherein
   the focusing lens is located at a side, facing away from the polarization converter, of the polarization lens; or
   the focusing lens is located between the polarization lens and the polarization converter.

3. The near-to-eye display device according to claim 2, wherein the focusing lens is a geometric optical lens with a fixed focal length;
   the display screen is configured to display a first image and a second image in the first time division mode;
   the polarization converter is configured to, in the second time division mode, convert emitted light rays for the first image into the first circularly polarized light rays and convert emitted light rays for the second image into the second circularly polarized light rays; and the polarization lens and the focusing lens are configured to focus the first circularly polarized light rays to a position of a first focal length and focus the second circularly polarized light rays to a position of a second focal length.

4. The near-to-eye display device according to claim 2, wherein the focusing lens is a liquid crystal lens;

control signals are applied to the liquid crystal lens in a third time division mode, to allow the liquid crystal lens to have n different focal lengths in the third time division mode;

the display screen is configured to display 2n different images in the first time division mode;

the polarization converter is configured to, in the second time division mode, convert emitted light rays for n images displayed by the display screen into the first circularly polarized light rays and convert emitted light rays of remaining n images displayed by the display screen into the second circularly polarized light rays;

the polarization lens and the focusing lens are configured to focus the first circularly polarized light rays for the n images to positions of n different first focal lengths and focus the second circularly polarized light rays of the remaining n images to positions of n different second focal lengths;

wherein the first focal lengths and the second focal lengths are all unequal, and n is an integer greater than or equal to 1.

5. The near-to-eye display device according to claim 1, wherein the display screen is one of a liquid crystal display, an organic light-emitting diode display, a micro-organic light-emitting diode display, a light emitting diode display or a micro-light emitting diode display.

6. The near-to-eye display device according to claim 5, wherein emitted light rays of the display screen are linearly polarized light rays; and the polarization converter is a liquid crystal box, a first signal and a second signal are applied to the liquid crystal box in the second time division mode;

under control of the first signal, the emitted light rays of the display screen are converted into the first circularly polarized light rays; and under control of the second signal, the emitted light rays of the display screen are converted into the second circularly polarized light rays.

7. The near-to-eye display device according to claim 5, wherein emitted light rays of the display screen are natural light rays; and the polarization converter comprises:

a polarizer, located at the light-emitting side of the display screen and configured to convert the emitted light rays of the display screen into linearly polarized light rays; and a liquid crystal box, located at a side, facing away from the display screen, of the polarizer;

wherein a first signal and a second signal are applied to the liquid crystal box in the second time division mode;

under control of the first signal, the linearly polarized light rays are converted into first circularly polarized light rays; and under control of the second signal, the linearly polarized light rays are converted into second circularly polarized light rays.

8. The near-to-eye display device according to claim 6, wherein the liquid crystal box comprises:

two substrates disposed oppositely;

a liquid crystal layer between the two substrates; and control electrodes on sides, facing the liquid crystal layer, of the substrates respectively;

wherein the first signal and the second signal are applied to the control electrodes in the second time division mode;

under control of the first signal, the liquid crystal layer is made to generate a first phase retardation quantity; and under control of the second signal, the liquid crystal layer is made to generate a second phase retardation quantity.

9. The near-to-eye display device according to claim 8, wherein a frequency of switching displayed images of the display screen is equal to a frequency of switching phase retardation quantities of the polarization converter.

10. The near-to-eye display device according to claim 9, wherein the switching frequency of the display screen is greater than or equal to 100 Hz.

11. The near-to-eye display device according to claim 9, wherein the switching frequency of the polarization converter is greater than or equal to 100 Hz.

12. The near-to-eye display device according to claim 7, wherein the liquid crystal box comprises:

two substrates disposed oppositely;

a liquid crystal layer between the two substrates; and control electrodes on sides, facing the liquid crystal layer, of the substrates respectively;

wherein the first signal and the second signal are applied to the control electrodes in the second time division mode;

under control of the first signal, the liquid crystal layer is made to generate a first phase retardation quantity; and under control of the second signal, the liquid crystal layer is made to generate a second phase retardation quantity.

13. The near-to-eye display device according to claim 1, wherein the polarization lens comprises:

a substrate; and a plurality of micro-nano structure units on the substrate;

wherein structure parameters of the micro-nano structure units are set to allow the first circularly polarized light rays and the second circularly polarized light rays to be focused at positions of different focal lengths.

14. The near-to-eye display device according to claim 1, wherein the near-to-eye display device is a virtual reality device.

* * * * *